US006988230B2

(12) United States Patent
Vermeulen et al.

(10) Patent No.: US 6,988,230 B2
(45) Date of Patent: Jan. 17, 2006

(54) TEST ARRANGEMENT FOR ASSEMBLAGES OF INTERGRATED CIRCUIT BLOCKS

(75) Inventors: Hubertus Gerardus Hendrikus Vermeulen, Eindhoven (NL); Thomas Franciscus Waayers, Eindhoven (NL); Guillaume Elisabeth Andreas Lousberg, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 414 days.

(21) Appl. No.: 10/245,489

(22) Filed: Sep. 17, 2002

(65) Prior Publication Data

US 2003/0079166 A1    Apr. 24, 2003

(30) Foreign Application Priority Data

Sep. 20, 2001  (EP)  ................................. 01203565

(51) Int. Cl.
 *G01R 31/28*   (2006.01)

(52) U.S. Cl. .................................................. 714/727

(58) Field of Classification Search ............... 714/724, 714/726, 727, 729, 733, 30
See application file for complete search history.

(56) References Cited

U.S. PATENT DOCUMENTS

| 5,673,276 A | * | 9/1997 | Jarwala et al. ............. 714/727 |
| 6,073,254 A |   | 6/2000 | Whetsel ...................... 714/30 |
| 6,223,315 B1 |  | 4/2001 | Whetsel ..................... 714/727 |

OTHER PUBLICATIONS

"Considerations for Implementing IEEE 1149.1 on System-on-a-Chip Integrated Circuits" by Steven F. Oakland. Proceedings of the international test conference (ITC); Oct. 2000, pp. 628-637.

* cited by examiner

*Primary Examiner*—Albert Decady
*Assistant Examiner*—James C. Kerveros
(74) *Attorney, Agent, or Firm*—Michael J. Ure

(57) ABSTRACT

An electronic device has a plurality of subdevices with each subdevice coupled to a test interface. The test interfaces are arranged in a chain of test interfaces by coupling the TDO contact of a predecessor test interface to the TDI contact of a successor test interface in the chain. In addition, at its beginning, the chain is extended with a boundary scan compliant test interface for testing other parts of electronic device. Both the TDO contact of the last test interface in the chain as well as the TDO contact of test interface are coupled to a bypass multiplexer, thus yielding two possible routes from test data input to test data output: through the full chain or through test interface only. Consequently, electronic device can be tested or debugged as a macro device or as a collection of subdevices.

9 Claims, 4 Drawing Sheets

TEST ARRANGEMENT FOR ASSEMBLAGES OF INTERGRATED CIRCUIT BLOCKS

The invention relates to an electronic device, comprising:
a plurality of subdevices;
a bypass multiplexer having a first input, a second input and an output;
a test data input;
a test data output coupled to the output of the bypass multiplexer;
a plurality of test interfaces, comprising:
a set of test interfaces, each test interface in the set of test interfaces being coupled to a subdevice from the plurality of subdevices, the set of test interfaces forming a chain of test interfaces in that a test data out contact of a predecessor test interface in the chain of test interfaces is coupled to a test data in contact of a successor test interface in the chain of test interfaces; and
a boundary scan compliant further test interface for controlling the bypass multiplexer, the further test interface having:
a further test data in contact coupled to the test data input; and
a further test data out contact coupled to the first input of the bypass multiplexer.

An embodiment of such an electronic device is disclosed in a paper of the conference journal Proceedings of the international test conference (ITC) 2000, p. 628–637, "Considerations for Implementing IEEE 1149.1 on System-on-a-Chip Integrated Circuits" by Steven F. Oakland, and in particular in FIG. 7 of the paper.

In the art of IC design, reuse of existing building blocks is becoming more and more a common place to reduce time-to-market. With the ongoing downscaling of integration dimensions, the complexity of these building blocks increases to such an extent that electronic devices, e.g. printed circuit boards (PCBs) carrying a plurality of subdevices, system-on-chip architectures, multiple chip modules (MCMs) and so on, are built up by smaller, already complex electronic devices, e.g. IP cores, embedded processors, integrated circuits and so on. When assembled into a single electronic device, the device will typically consist of a number of subdevices each having their own test architecture, e.g. a boundary scan test arrangement accessible through a test interface. Typically, such a test interface, e.g. a test access port (TAP), receives control signals through a TAP controller for controlling the various states of the test interface. In addition, the electronic device into which the various subdevices are integrated may also comprise some logic to-be-tested of its own, like clock synchronization logic. This poses complications in the testing and/or debugging of such devices, because the direct accessibility of each of those test interfaces, through input/output contacts in the periphery of the electronic device is unfeasible in terms of contact resource and cost. In addition, the various test interfaces have to be arranged in such a fashion that each of the subdevices can be tested/debugged on its own as well as in a cluster of subdevices, with the total electronic device acting as a single device under test being the upper limit.

The ITC 2000 paper discloses an electronic device having a plurality of embedded processors with a boundary scan architecture. TAP accessibility is provided by connecting the embedded processor TAPs in series, with the test data in contact of a next TAP connected to the test data out contact of a former TAP, thus forming a chain of embedded processor TAPs. In addition, an instruction register of a system-level master TAP is included in the chain as well, whereas the data registers and the bypass register of the system-level TAP are arranged in parallel with the corresponding registers of the test interfaces in the chain, thus creating a hierarchy in the data and bypass parts of the access mechanism.

It is a disadvantage of the known arrangement that the use of the data register of the master test interface simultaneous with the data registers of the TAPs of the embedded processors is prevented by the hierarchical access mechanism. Especially when debugging an embedded processor, its interaction with surrounding system-level logic can be important to obtain a large fault coverage during debug. This is difficult in the known arrangement, because the system-level logic under control of the master TAP cannot be fed with debug data when an embedded processor is being debugged.

Inter alia, it is an object of the invention to provide an electronic device of the kind described in the opening paragraph having increased debug functionality.

Now, the object of the invention is realized in that a test data out contact of a last test interface in the chain of test interfaces is coupled to the second input of the bypass multiplexer; and the further test data out contact is further coupled to a test data in contact of a first test interface in the chain of test interfaces.

The full addition of the further test interface to the chain of test interfaces is particularly advantageous, because data can be provided to the subdevice test interfaces and the further test interface at the same time. For example, a subdevice can be debugged while debug data is also provided to the surrounding logic not belonging to a subdevice via the further test interface or another test interface, thus yielding improved fault coverage during debug. Obviously, similar advantages are obtained during other functional tests.

It is an advantage if the further test interface comprises a bypass controller coupled to an instruction register of the further test interface for controlling the bypass multiplexer.

Typically, the content of the instruction register of a boundary scan compliant test interface specifies which register of the test interface is activated, e.g. the bypass, data, boundary scan or the optional identification register. By monitoring the content of the instruction register the bypass controller can force the bypass multiplexer to switch to a bypass state if an appropriate instruction, e.g boundary scan test or bypass instruction is present in the instruction register. Furthermore, it facilitates the detectability of additional, dedicated further test interface instruction, e.g. a bypass for debug instruction, for which the further test interface can be bypassed without selecting the bypass state of the bypass multiplexer. This way, other test interfaces from the chain of test interfaces can be easily selected as a device under test or as a device under debug.

It is another advantage if the further test interface comprises a register coupled to the bypass controller for storing instruction information of each test interface from the set of test interfaces.

The inclusion of a register for storing instruction information, e.g. the instruction opcodes, of each test interface from the set of test interfaces is useful when the test or debug software does not facilitate the use of dedicated test or debug instructions. This prevents the erroneous switching of the bypass multiplexer to a bypass state when the further test interface is bypassed with the BYPASS instruction to facilitate the testing or debugging of a test interface from the set of test interfaces, because the instruction forcing that test interface into the desired mode will also be detected by the bypass controller in the additional register.

It is yet another advantage if the register is further coupled to a third input of the bypass multiplexer.

The connection of the register to the bypass register renders the register testable via the test data input and test data output of the electronic device, thus improving the test coverage of the device.

In an embodiment of the present invention, the electronic device further comprises a test mode control unit for controlling a test mode of a test interface in the chain of test interfaces, the test mode control unit comprising: a bit pattern decoder coupled to an instruction register of the further test interface; and a logic circuit having a first input coupled to a test mode select contact of the further test interface; a second input coupled to the bit pattern decoder; and an output coupled to the chain of test interfaces.

If an instruction indicating the test or debug of the part of the electronic device under control of the further test interface with a designated bit pattern is present in the instruction register, the bit pattern decoder will detect this pattern and will forward a signal to the logic circuit e.g. an AND gate. All test interfaces in the chain of test interfaces are connected to the output of the logic circuit through their respective TMS contacts, and consequently, the whole chain can be switched off, providing a test or debug mode in which the part of the electronic device under control of the further test interface can be tested or debugged in isolation.

In a further embodiment of the present invention, the electronic device comprises a test mode control unit for providing a test interface from the plurality of test interfaces with an individual test mode select signal; a set of multiplexers, each multiplexer from the set of multiplexers comprising a first input, a second input and an output, the set of multiplexers forming a chain of multiplexers in that the first input of a successor multiplexer in the chain of multiplexers is coupled to the test data out contact of the predecessor test interface in the chain of test interfaces; the output of a predecessor multiplexer in the chain of multiplexers is coupled to the second input of a successor multiplexer and to a test data in contact of the predecessor test interface in the chain of test interfaces; the first input of the first multiplexer in the chain of multiplexers is coupled to the further test data out contact; the second input of the first multiplexer in the chain of multiplexers is coupled to the test data input; and the output of the last multiplexer in the chain of multiplexers is coupled to the first input of the bypass multiplexer, wherein the further test data out contact is coupled to the first input of the bypass multiplexer via the chain of multiplexers.

The aforementioned insertion of a chain of a further multiplexers in the chain of test interfaces provides direct bypass routes from the test data input contact to the test data output contact for each test interface in the chain of test interfaces, including a bypass route around the further test interface. Consequently, even the further test interface can be switched off, which provides the possibility of creating a test or debug state in which only one or more test interfaces from the chain of test interfaces are selected.

It is an advantage of the further embodiment of the present invention if the the further test interface comprises a data register being arranged to provide a multiplexer from the chain of multiplexers with an individual control signal, and being arranged to provide the bypass multiplexer with a control signal; and the test mode control unit comprises a bit pattern decoder coupled to the data register; and a logic circuit, having: a first input coupled to a test mode select contact of the further test interface; a second input coupled to the bit pattern decoder; and a plurality of outputs, wherein an output from the plurality of outputs is arranged to provide the test interface from the plurality of test interfaces with the individual test mode select signal.

In this arrangement, the plurality of test interfaces and accompanying bypass multiplexers are controlled by shifting in an appropriate bit pattern into the data register of the further test interface. Consequently, the test arrangement can be reconfigured during test, which provides a very flexible test architecture, in which any number of test interfaces ranging from one to the full plurality of test interfaces can be included.

It is another advantage of the further embodiment of the present invention if the electronic circuit further comprises a further contact for providing the test mode control unit with a test interface selection signal, the test mode control unit being arranged to provide a multiplexer from the chain of multiplexers with an individual control signal; and to provide the bypass multiplexer with a control signal.

The extension of the electronic device with a dedicated contact for providing a test interface with a dedicated test mode select signal provides an arrangement in which targeted test interfaces can be readily switched off and accompanying multiplexers can be switched to a bypass state from outside the electronic device, e.g. by the external tester.

It is noted that U.S. Pat. No. 5,673,276 discloses a multiple chip module (MCM) having n semiconductor chips, n being an integer, with each chip having a boundary scan architecture being extended with a bypass circuit, as decribed in col. 5, lines 24–27 and col. 5, lines 35–38 as well as in claim 1, col. 10, lines 1–6. Multiplexer 38 of such a bypass circuit is controlled by an externally generated signal BCE, which enables testing of the MCM either as a single device or as a multiple chip architecture, in which each of the n chips is active during boundary scan test. As stipulated in col. 2, lines 17–25, the aim of the invention of U.S. Pat. No. 5,673,276 is to create an arrangement that is boundary scan compliant as a macro device. It is emphasized that that arrangement is substantially different from the present invention, because an external control signal is used to control each of the bypass multiplexers of the TAPs of the n semiconductor chips, as opposed to the further multiplexers under control of the bypass control means or the further test interface of the present invention, where a subset of test interfaces in the chain of test interfaces can be selected for test or debug purposes; an option that is unavailable in U.S. Pat. No. 5,673,276 as a result of the use of the global bypass signal that either bypasses n–1 TAPs or includes all n TAPs in the test arrangement. It is therefore stipulated that the present invention exhibits non-obvious and advantageous differences with U.S. Pat. No. 5,673,276.

Now, the electronic device according to the present invention is decribed in more detail and by way of non-limiting example with reference to the accompanying drawings, wherein.

Figure 1:
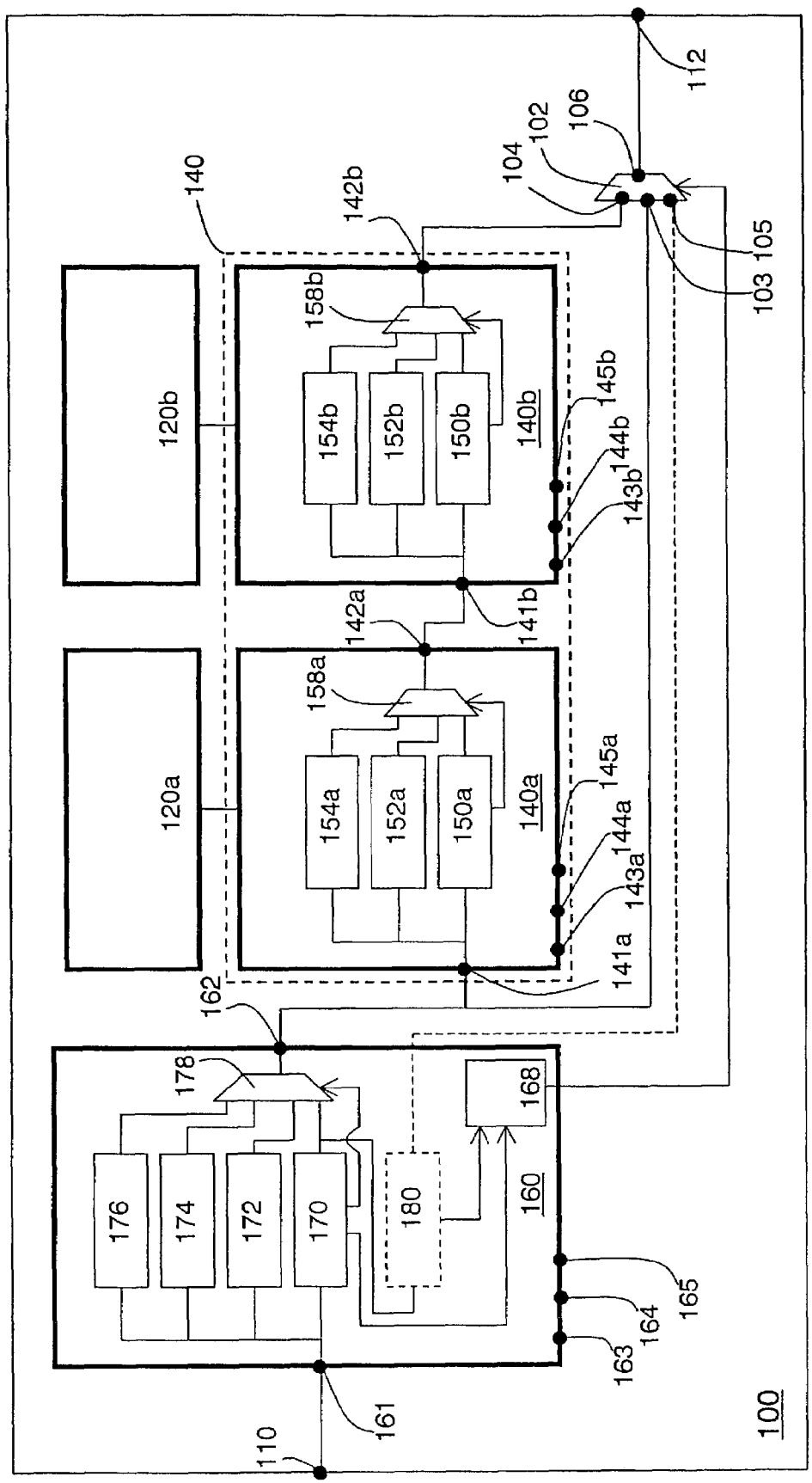
FIG. 1 shows an embodiment of the electronic device according to the present invention.

In FIG. 1, electronic device 100 carries a number of subdevices 120a and 120b. Obviously, this arrangement can be extended without departing from the scope of the invention. Electronic device 100 can, for instance, be an integrated circuit carrying a number of IP cores, a printed circuit board carrying a number of integrated circuits (ICs) or a multi chip module carrying a number of semiconductor chips and so on. Each of the subdevices 120a, 120b is extended with a respective test interface 140a, 140b, e.g. a test access port (TAP), whereas electronic device 100 is extended with a IEEE 1149.1 standard, e.g. boundary scan (BS), compliant further test interface 160. The further test interface 160 typically has a test data in (TDI) contact 161 coupled to a test data input 110 of electronic device 100, a test data out (TDO) contact 162, a test mode select (TMS) contact 163, a test clock (TCK) contact 164 and a test reset (TRST) contact 165. In addition, the further test interface 160 has an instruction register 170, a data register 172, a bypass register 174, and a boundary scan register 176 coupled to a number of I/O contacts of the electronic device 100. The registers 170, 172, 174 and 176 are coupled to TDO contact 162 through a multiplexer 178 under control of decode logic not shown that is coupled to instruction register 170. Optionally, an identification register not shown is also present.

Typically, test interfaces 140a and 140b have similar components as further test interface 160, e.g. respective TDI contacts 141a and 141b, respective TDO contacts 142a and 142b, respective TMS contacts 143a and 143b, respective TCK contacts 144a and 144b, and respective TRST contacts 145a and 145b, as well as respective instruction registers 150a and 150b, respective data registers 152a and 152b and respective bypass registers 154a and 154b. It is emphasized that, in the embodiments of the present invention, the TMS, TCK and TRST contacts of test interfaces 140a, 140b and 160 are connected to the appropriate signal leads, and that the absence of these leads in the various Figs. is for reasons of clarity only. Registers 150a, 152a and 154a are coupled to TDO contact 142a through a multiplexer 158a under control of decode logic not shown that is coupled to instruction register 150a, and registers 150b, 152b and 154b are coupled to TDO contact 142b through a multiplexer 158b under control of decode logic not shown that is coupled to instruction register 150b. In the embodiment of FIG. 1, test interfaces 140a and 140b lack a BS register, because such a register is not strictly necessary for the intended debug purposes. However, the presence of a BS register in test interfaces 140a and 140b is preferred, because it would render test interfaces 140a and 140b compliant with the BS standard.

Test interfaces 140a and 140b form a chain of test interfaces 140, in which the TDO contact 142a of predecessor test interface 140a is coupled to the TDI contact 141b of successor test interface 140b. It will be obvious to anyone skilled in the art that the chain of test interfaces 140 can be readily extended to include a larger number of test interfaces. Further test interface 160 is added to the chain of test interfaces 140 by the coupling of its TDO contact 162 to the TDI contact 141a of the first test interface 140a in the chain of test interfaces 140. In addition, TDO contact 162 is also coupled to the first input 103 of a bypass multiplexer 102, which has an output 106 coupled to a test data output 112 of electronic device 100. Bypass multiplexer 102 also has a second input 104 coupled to the TDO contact 142b of the last test interface 140b in the chain of test interfaces 140. Bypass multiplexer 102 is controlled by bypass controller 168 coupled to instruction register 170. Bypass controller 168 can be a part of the decode logic not shown that is coupled to instruction register 170. It is stipulated that this arrangement is BS compliant; electronic device 100 can be tested as a single device, in which case the chain of test interfaces 140 is bypassed through the direct coupling of TDO contact 162 to first input 103 of bypass multiplexer 102, and it can be tested as a plurality of subdevices 120a and 120b by inclusion of the chain of test interfaces 140 in between TDO contact 162 and bypass multiplexer 102. Typically, the chain of test interfaces 140 is bypassed when instruction register 170 comprises certain instructions e.g. a boundary scan test instruction or a bypass instruction.

In addition, subdevices 120a and 120b can be tested or debugged individually or as a collection, e.g. subset, of subdevices. To this end, apart from the appropriate instructions for test interfaces 140a and 140b associated with subdevices 120a and 120b respectively, a dedicated bypass-for-test or bypass-for-debug instruction has to be shifted into instruction register 170 to select bypass register 174 without bypassing the chain of test interfaces 140. This is important, because bypasing the chain of test interfaces 140 would prevent the observation of the desired test or debug results on test data output 112.

In an alternative arrangement, further test interface 160 also has a register 180 coupled to bypass decoder 168 for storing the instruction information of each test interface in the set of test interfaces, e.g. test interfaces 140a and 140b. When the instruction data is shifted into the chain of test interfaces 140, it is also copied into register 180. This obviates the need for a dedicated bypass-for-test or bypass-for-debug instruction, because now a bypass instruction in instruction register 170 will not automatically lead to the bypass of the chain of test interfaces 140. Only if none of the test interfaces 140a and 140b in the chain of test interfaces 140 is selected for test or debug, as indicated by the content of register 180, bypass multiplexer 102 will be set to bypass the chain of test interfaces 140. Preferably, register 180 is coupled a third input 105 of bypass multiplexer 102. This renders the register 180 testable from the outside throughtest data input 110 and test data output 112.

Now, the remaining Figs. are described while referring back to FIG. 1 and its detailed description. Corresponding reference numerals have similar meanings unless stated otherwise. It is emphasized that subdevices 120a and 120b are still intended to be present; they have been omitted from the following Figs. for reasons of clarity only.

Figure 2:
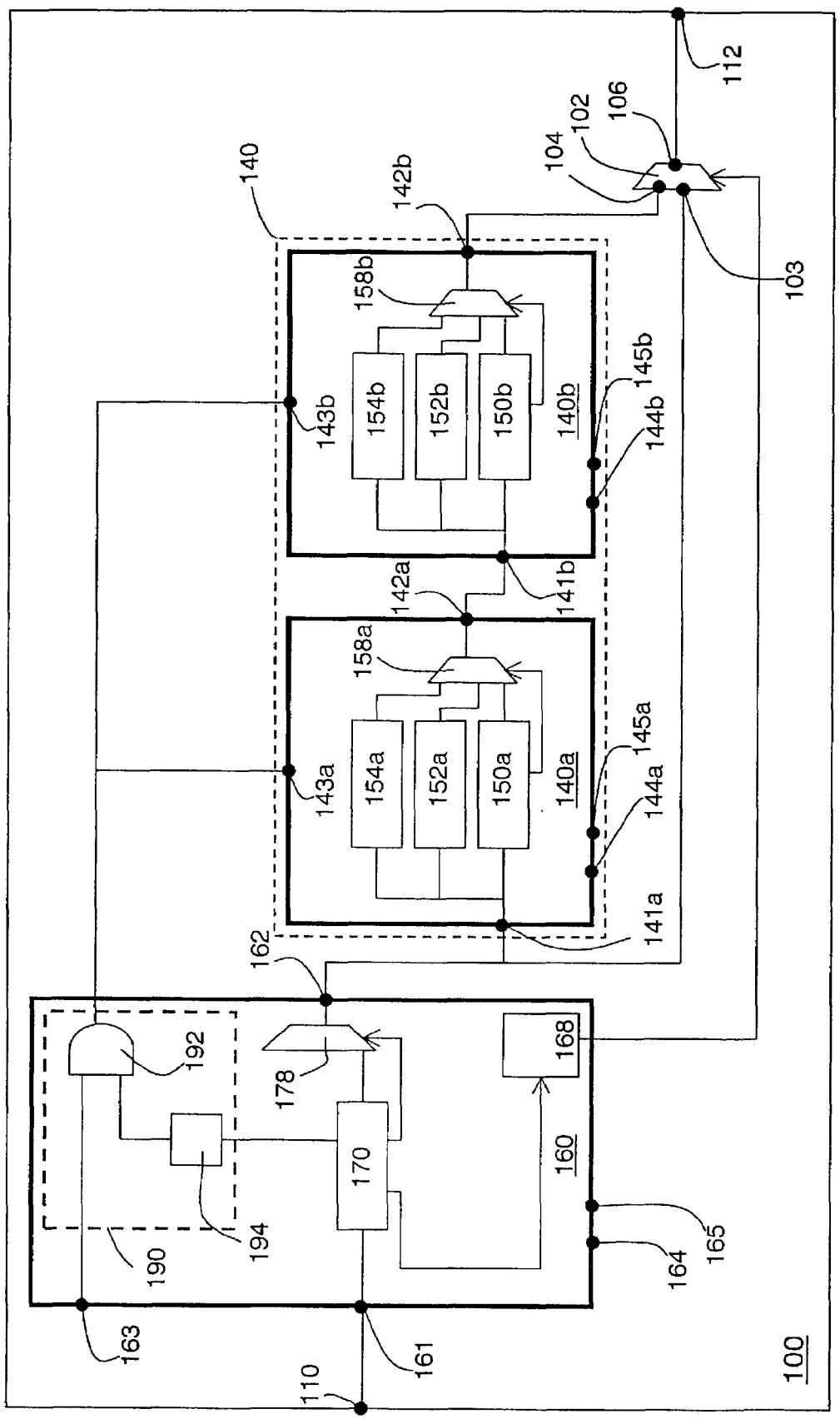
FIG. 2 shows another embodiment of the electronic device according to the present invention.

In FIG. 2, a test mode control unit 190 is integrated in further test interface 160. Registers 172, 174 and 176 have been omitted from further test interface 160 for reasons of clarity only; they are still present in this particular embodiment of the electronic device according to the present invention. Here, test mode control unit has a logic circuit 192, e.g. an AND gate, with an output coupled to each of the TMS contacts 143a and 143b of the test interfaces 140a and 140b in the chain of test interfaces 140. AND gate 192 is coupled through a first of its inputs with the TMS contact 163 of the further test interface. In addition, test mode control unit has a bit pattern decoder 194 coupled between the instruction register 172 and a second input of AND gate 192. Bit pattern decoder 194 is arranged to evaluate part of a bit pattern of an instruction opcode in instruction register 170. It is emphasized that, when the bit pattern under evaluation consists of a single bit, bit pattern decoder can be as simple as an inverter or a mere wire coupling the corresponding data storage element of instruction register 170 with the second input of AND gate 192. If further test interface 160 is provided with a TMS signal through its TMS contact 163, test interfaces 140a and 140b in the chain of test interfaces 140 can be included in the test arrangement or excluded from the test arrangement, e.g. switched to a functional mode, by feeding the test mode control unit 190 with an appropriate bit pattern in instruction register 170.

The exclusion of test interfaces 140a and 140b from the test arrangements prevents that a JTAG instruction can still be loaded into the instruction register of the corresponding test interface and subsequently executed, which could affect the operation of electronic device 100. Consequently, this has the advantage that the subdevices under test or debug do not suffer from interaction with other subdevices in a passive, e.g. bypass, test mode, which contributes to improved testability and debug functionality of the electronic device 100. Consequently, electronic device 100 can be tested or debugged as a macro device, e.g. with test interfaces 140a, 140b and 160 all in test mode, or with all subdevices 120a, 120b excluded from the test or debug arrangement by forcing test interfaces 140a and 140b in their functional mode by using instructions having dedicated bit patterns. In addition, it is stipulated that it will be obvious to anyone skilled in the art that AND gate 192 can readily be replaced by an equivalent logic gate or combination thereof without departing from the scope of the invention.

Figure 3:
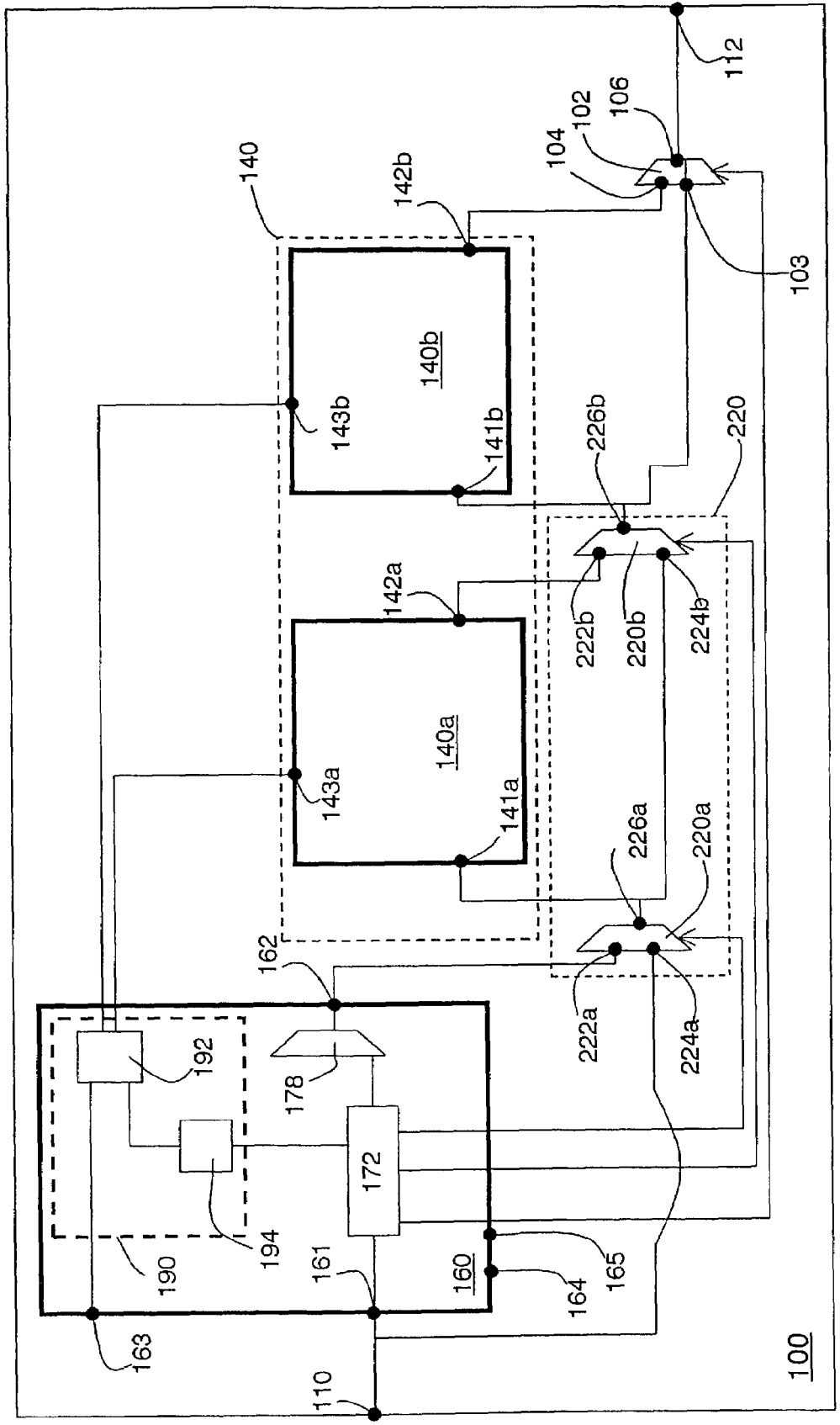
FIG. 3 shows yet another embodiment of the electronic device according to the present invention.

FIG. 3 is described with backreference to FIG. 2 and its detailed description. It is stipulated that registers 142a, 144a and 146a of test interface 140a, registers 142b, 144b and 146b of test interface 140b as well as TCK contacts 144a and 144b and TRST contacts 145a and 145b are omitted from FIG. 3 with respect to FIG. 2 for reasons of clarity only. Similarly, the fact that instruction register 170 has been replaced by data register 172, does not imply the absence of instruction register 170 from further test interface 160. In this particular embodiment of the present invention, bit pattern decoder 194 is coupled to data register 172 and logic circuit 192. In addition, the chain of test interfaces 140 is interleaved with a chain of multiplexers 220 in the following manner. The TDI contact 141a of a predecessor test interface 140a in the chain of test interfaces 140 is coupled to an output 226a of a predecessor multiplexer 220a in the chain of multiplexers 220. The TDO contact 142a of a predecessor test interface 140a in the chain of test interfaces 140 is coupled to a first input 222b of a successor multiplexer 220b in the chain of multiplexers 220. In addition, the output of a predecessor multiplexer 220a is also coupled to a second input 224b of a successor multiplexer 220b, thus creating a bypass path around a predecessor test interface 140a. The first input 222a of first multiplexer 220a in the chain of multiplexers 220 is coupled to TDO contact 162, and the second input 224a of first multiplexer 220a in the chain of multiplexers 220 is coupled to test data input 110, thus providing a bypass path for further test interface 160 as well. Finally, the output 226b of the last multiplexer 220b in the chain of multiplexers 220 is coupled to the first input 103 of bypass multiplexer 102. Now, TDO contact 162 is coupled to the first input 103 of bypass multiplexer 102 through the chain of multiplexers 220. It is once more emphasized that the chain of test interfaces 140 and the accompanying chain of multiplexers 220 can be readily extended without departing from the scope of the invention. Furthermore, it is explicitly stipulated that the chain of test interfaces 140 may comprise a test interface that is not bypassable, e.g. that does not have an accompanying multiplexer in the chain of multiplexers 220. Consequently, such a test interface cannot be excluded from the selected test arrangement.

Each multiplexer in the chain of multiplexers 220 as well as bypass multiplexer 102 are controlled by the content of data register 172. Therefore, bypass decode unit 168 may be omitted from the embodiment depicted in FIG. 3. In other words, data register 172 is arranged to provide each of the multiplexers 220a and 220b from the chain of multiplexers 220 with an individual control signal, as well as bypass multiplexer 102 with a control signal. In addition, bit pattern decoder 194 is arranged to provide logic circuit 192 with a plurality of signals for selecting and deselecting test interfaces 140a, 140b and 160 from the targeted test arrangement. Logic circuit 192 can comprise a plurality of AND gates, each of them having a first input coupled to TMS contact 163, a second input arranged to receive one of the plurality of signals from the bit pattern decoder 194 and an output coupled to one of the targeted test interfaces. The coupling between test mode select unit 190 and the test interfaces from the chain of test interfaces 140 is preferably realized by a data communication bus. It will be obvious to those skilled in the art that other embodiments of logic circuit 192 are readily available without departing from the scope of the invention. In addition, bit pattern decoder 194 may be as simple as a collection of wires, a collection of inverters or a combination thereof.

This arrangement enables a very flexible test or debug setup; by inserting an appropriate data pattern into data register 172, each test interface 140a, 140b and 160 from the plurality of test interfaces present can either be bypassed and switched to a functional mode or included in the test or debug setup on an individual basis by the chain of multiplexers 220 including bypass multiplexer 102, and by test mode select unit 190 respectively. This setup can also be altered at run-time; by shifting in a new bit pattern into data register 172, the chain of test interfaces 140 and chain of multiplexers 220 reconfigure themselves accordingly. It is stipulated that if further test interface 160 is switched to a functional, e.g. run test idle, mode, the modus operandi of electronic device 100 can only be altered by providing further test interface 160 with a test reset signal on TRST contact 165.

Figure 4:
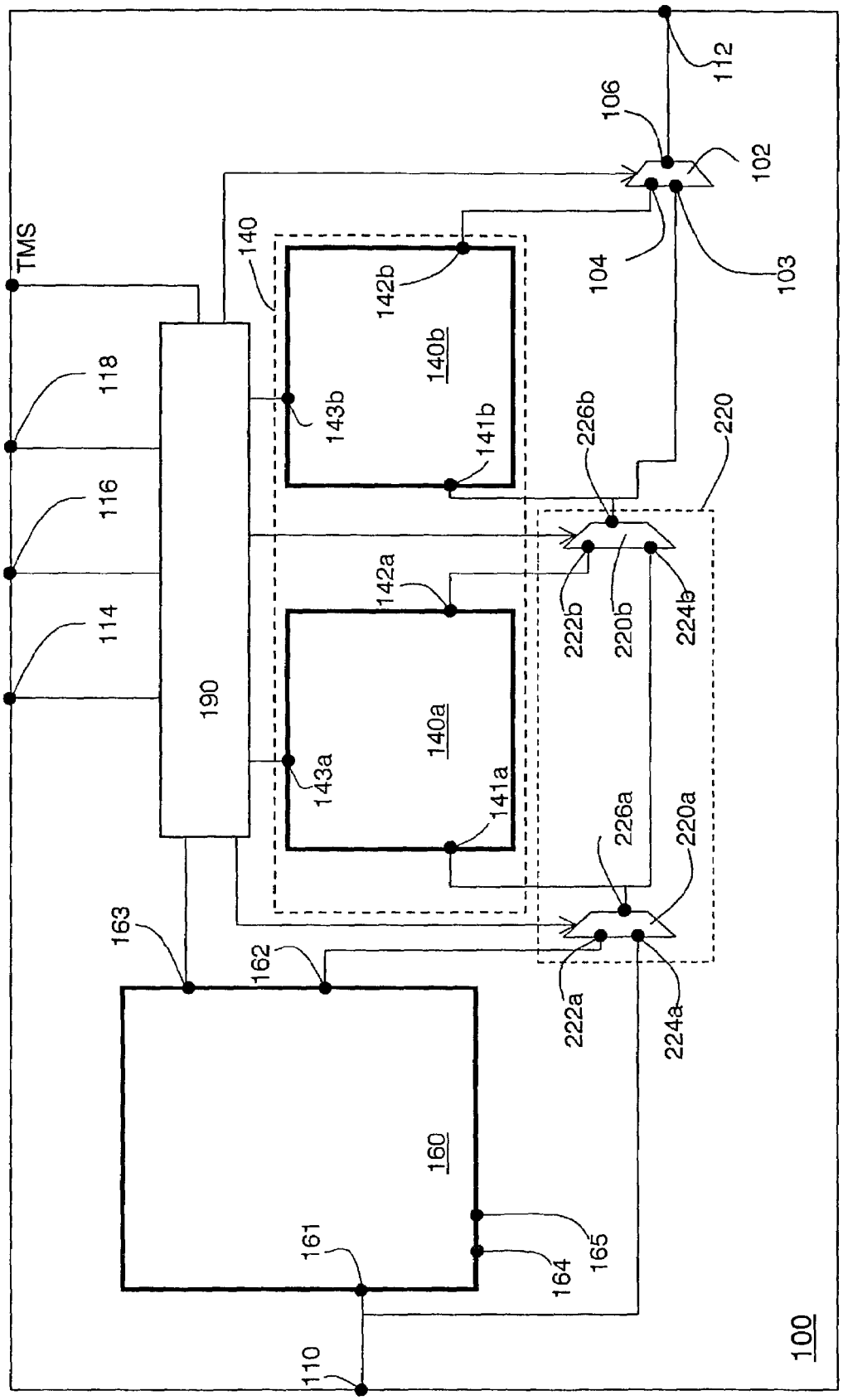
FIG. 4 shows yet another embodiment of the electronic device according to the present invention.

In FIG. 4, an alternative arrangement for selecting parts of electronic device 100 for test or debug purposes is depicted. FIG. 4 is described with backreference to FIG. 3 and its detailed description. In addition, it is stated that data register 172 is omitted from further test interface 160 for reasons of clarity only; it does not necessarily indicate its absence from further test interface 160.

Electronic device 100 is extended with a test mode selection unit 190 for providing each of the test interfaces 140a and 140b in the chain of test interfaces 140 as well as further test interface 160 with a dedicated TMS signal via their respective TMS contacts 143a, 143b and 163. In addition, multiplexers 220a, 220b, e.g. the multiplexers in the chain of multiplexers 220, and bypass multiplexer 102 are also responsive to test mode selection unit 190. In other words, test mode control unit 190 is arranged to provide the multiplexers from the chain of multiplexers 220 with an individual control signal as well as the bypass multiplexer 102 with a control signal. A dedicated TMS signal is fed to the test mode control unit 190 through a TMS contact of electronic device 100. In addition, test mode control unit 190 is provided a test interface specific test selection signal through a dedicated contact of electronic device 100. For instance, further test interface 160 can be selected or deselected by providing test mode control unit 190 with the appropriate test interface selection signal through contact 114, test interface 140a can be selected or deselected by providing test mode control unit 190 with the appropriate test interface selection signal through contact 116, whereas a dedicated test interface selection selection signal for test interface 140b is received through contact 118 and so on. Consequently, test interfaces that are not controlled through the BS test port, e.g. test data input 110, can be kept running in the test logic reset state, e.g. their functional mode, and the multiplexers for bypassing these test interfaces will be switched into the bypass state under control of test mode control unit 190. Preferably, the test interface selection signal used to put a test interface in its test logic reset state is also used to switch the corresponding bypass multiplexer in the bypass state. It is emphasized that the IEEE 1149.1 standard allows for the addition of contacts 114 and 116, which renders the arrangement of FIG. 2 compliant with the BS standard.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

What is claimed is:

1. An electronic device, comprising:
a plurality of subdevices;
a bypass multiplexer having a first input, a second input and an output;
a test data input;
a test data output coupled to the output of the bypass multiplexer;
a plurality of test interfaces, comprising:
a set of test interfaces, each test interface in the set of test interfaces being coupled to a subdevice from the plurality of subdevices, a test data out contact of a predecessor test interface in a chain of test interfaces being coupled to a test data in contact of a successor test interface in the chain; and
a boundary scan compliant further test interface for controlling the bypass multiplexer, the further test interface having:
a further test data in contact coupled to the test data input; and
a further test data out contact coupled to the first input of the bypass multiplexer;
wherein: a test data out contact of a last test interface in the chain of test interfaces is coupled to the second input of the bypass multiplexer; and the further test data out contact is further coupled to a test data in contact of a first test interface in the chain of test interfaces.

2. An electronic device as claimed in claim 1, wherein the further test interface comprises a bypass controller coupled to an instruction register of the further test interface for controlling the bypass multiplexer.

3. An electronic device as claimed in claim 2, wherein the further test interface comprises a register coupled to the bypass controller for storing instruction information of each test interface from the set of test interfaces.

4. An electronic device as claimed in claim 3, wherein the register is further coupled to a third input of the bypass multiplexer.

5. An electronic device as claimed in claim 1, characterized in further comprising a test mode control unit for controlling a test mode of a test interface in the chain of test interfaces, the test mode control unit comprising: a bit pattern decoder coupled to an instruction register of the further test interface; and a logic circuit having: a first input coupled to a test mode select contact of the further test interface; a second input coupled to the bit pattern decoder; and an output coupled to the chain of test interfaces.

6. An electronic device as claimed in claim 5, wherein the logic circuit comprises an AND gate.

7. An electronic device as claimed in claim 1, characterized in comprising: a test mode control unit for providing a test interface from the plurality of test interfaces with an individual test mode select signal; a set of multiplexers, each multiplexer from the set of multiplexers comprising a first input, a second input and an output, the set of multiplexers forming a chain of multiplexers in that: the first input of a successor multiplexer in the chain of multiplexers is coupled to the test data out contact of the predecessor test interface in the chain of test interfaces); the output of a predecessor multiplexer in the chain of multiplexers is coupled to the second input of a successor multiplexer and to a test data in contact of the predecessor test interface in the chain of test interfaces; the first input of the first multiplexer in the chain of multiplexers is coupled to the further test data out contact; the second input of the first multiplexer in the chain of multiplexers is coupled to the test data input; and the output of the last multiplexer in the chain of multiplexers is coupled to the first input of the bypass multiplexer, wherein the further test data out contact is coupled to the first input of the bypass multiplexer via the chain of multiplexers.

8. An electronic device as claimed in claim 7, wherein the further test interface comprises a data register being arranged to provide a multiplexer from the chain of multiplexers with an individual control signal, and being arranged to provide the bypass multiplexer with a control signal; and the test mode control unit comprises: a bit pattern decoder coupled to the data register; and a logic circuit, having: a first input coupled to the teat mode select contact of the further test interface; a second input coupled to the bit pattern decoder; and a plurality of outputs, wherein an output from the plurality of outputs is arranged to provide the test interface from the plurality of test interfaces with the individual test mode select signal.

9. An electronic device as claimed in claim 7, characterized by further comprising: a further contact for providing the test mode control unit with a test interface selection signal, the test mode control unit being arranged: to provide a multiplexer from the chain of multiplexers with an individual control signal; and to provide the bypass multiplexer with a control signal.

* * * * *